(12) United States Patent
Kim et al.

(10) Patent No.: US 6,377,489 B1
(45) Date of Patent: Apr. 23, 2002

(54) METHOD OF ERASING A FLASH MEMORY DEVICE

(75) Inventors: Seung Deok Kim; Sung Jin Yoo, both of Sungnam (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,492

(22) Filed: Nov. 28, 2000

(30) Foreign Application Priority Data

Dec. 28, 1999 (KR) ............................................. 99-64005

(51) Int. Cl.[7] ................................................ G11C 11/34
(52) U.S. Cl. ............................ 365/185.26; 365/185.33
(58) Field of Search ......................... 365/185.23, 185.26

(56) References Cited

U.S. PATENT DOCUMENTS 5,912,842 A * 6/1999 Chang et al. .......... 365/185.11

* cited by examiner

*Primary Examiner*—Trong Phan
*Assistant Examiner*—M Tran
(74) *Attorney, Agent, or Firm*—Pennie & Edmonds LLP

(57) ABSTRACT

A method can perform the erase operation on a byte or word basis, in such a manner that erase is allowed via the source by applying a negative voltage to the control gate and applying the high voltage to the select gate but the erase is not allowed if the select gate becomes a low voltage.

10 Claims, 1 Drawing Sheet

METHOD OF ERASING A FLASH MEMORY DEVICE

FIELD OF THE INVENTION

The invention relates generally to a method of erasing a flash memory device, and more particularly to, a method of erasing a flash memory device in which erase can be performed on a byte or word basis, in such a maimer that erase is allowed via the source by applying a negative voltage to a control gate and applying a high voltage to a select gate but the erase is not allowed if the select gate becomes a low voltage.

BACKGROUND OF THE INVENTION

EEPROM is a volatile memory device to which program or erase can be performed on a byte or word basis, wherein a cell requires two transistors, as shown in FIG. 1. In other words, the drain terminal of the EEPROM cell and the source terminal of the NMOS transistor are connected each other, the drain terminal of the NMOS transistor is connected to the bit line and the gate terminal is connected to the word line. The reason why the cell is formed of two transistors connected each other is that neighboring cells not selected are not affected when the selected cell is erased. Thus, as the EEPROM cell has two transistors, the layout area of the EEPROM cell having two transistors must be twice greater than that of the cell that is formed by one transistor.

In order to supplement this drawback, there has been proposed a flash memory device having one transistor in the cell. However, the flash memory device performs the erase operation on a block basis and performs the program operation on a byte or word basis, by dividing their chips into various blocks having uniform sizes (or different sizes) in order to store data in the cell. Thus, as the flash memory cell uses only one transistor in the cell compared to the conventional EEPROM cell having two transistors, the layout area of the cell can be reduced to half.

However, there is a problem that the flash memory device could not be erased on a byte or word basis.

SUMMARY OF THE INVENTION

It is therefore an object of the present invention to provide a method of erasing a flash memory device capable of performing an erase operation on a byte or word basis.

In order to accomplish the above object, a method of erasing a flash memory device having a source, a drain, a floating gate, a control gate and a select gate according to the present invention is characterized in that the method performs an erase operation on a byte or word basis, in such a manner that a high negative voltage is applied to the control gate, a high positive voltage is applied to the select gate, the power supply is applied to the source and the drain is made floating, in a selected cell, and a high negative voltage is applied to the control gate, a voltage of 0V is applied to the select gate, the power supply is applied to the source and the drain is made floating or a voltage of 0V is applied to the control gate, a high positive voltage is applied to the select gate, and the source and drain are made floating, in a cell not selected.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
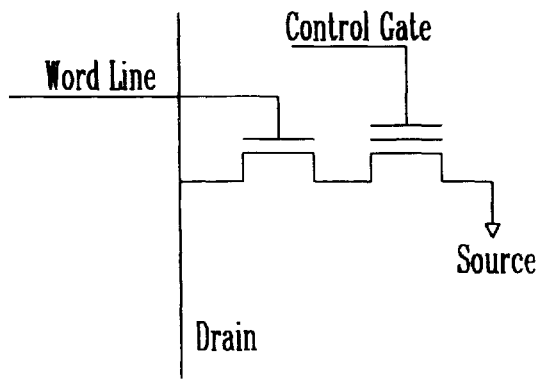
FIG. 1 is a schematic view of a conventional EEPROM.

The present invention will be described in detail by way of a preferred embodiment with reference to accompanying drawings, in which like reference numerals are used to identify the same or similar parts.

Figure 2:
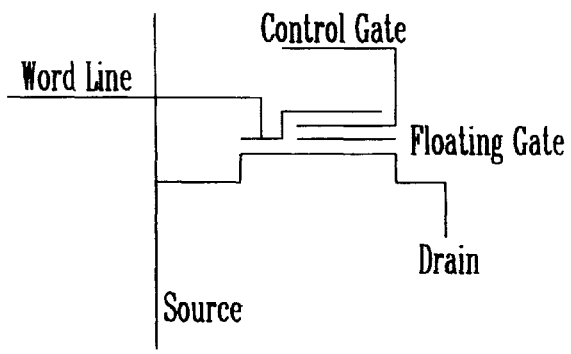
FIG. 2 is a schematic view of a split gate-type flash memory cell according to the present invention.

FIG. 2 is a schematic view of a cell for explaining a method of erasing a split gate-type flash memory cell.

As shown in FIG. 2, the split gate-type flash memory cell is consisted of a source, a drain, a floating gate, a control gate and a select gate (or word line).

Table 1 shows the condition by which the bias is applied to respective terminals depending on the conventional erase method.

TABLE 1

| | Applied Voltages for Conventional Erasing | | | | |
|---|---|---|---|---|---|
| | Drain | Select Gate | Control Gate | Source | Substrate |
| Bias | Vcc | 0 V | −9 V | Floating | 0 V |

As can be seen from Table 1, when performing the erase operation, the conventional method applied a high negative voltage (−9V) to all the control gates having blocks of uniform sizes, applied a power supply (Vcc) to the drain and applied a voltage of 0V to all the select gates.

Table 2 shows the condition by which the bias is applied to respective terminals, for performing the erase operation on a byte or word basis according to the present invention.

TABLE 2

| | Applied Voltages for Erasing in Accordance with Present Invention | | | | |
|---|---|---|---|---|---|
| | Drain | Select Gate | Control Gate | Source | Substrate |
| Bias | Floating | 9 V | −9 V | Vcc | 0 V |

As can be seen from Table 2, the condition for performing the erase operation on a byte or word according to the present invention includes applying a high negative voltage (−9V) to the control gate, making the drain floating, applying a high positive voltage (9V) to the select gate and applying a power supply (Vcc) to the source. The reason why the high positive voltage (9V) is applied to the select gate is that the source voltage can be sufficiently transmitted.

Figure 3:
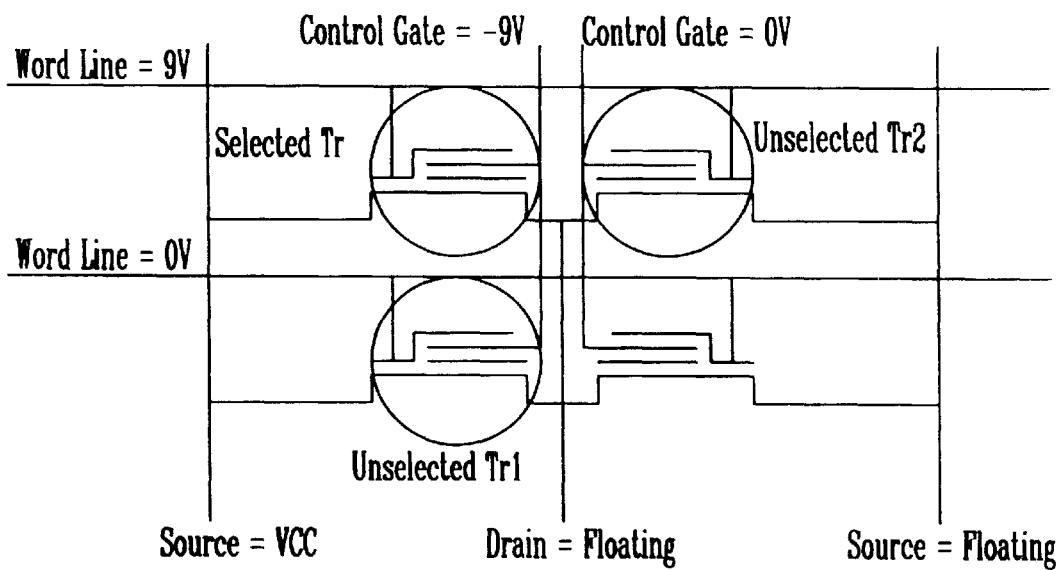
FIG. 3 is a schematic view of a split gate-type flash memory cell array according to the present invention.

At this time, the condition of neighboring cell that was not selected is as follows: Firstly, a high negative voltage is applied to the control gate, a voltage of 0V is applied to the select gate, the power supply is applied to the source and the drain is floating, as can be seen from a first transistor in FIG. 3. Secondly, a voltage of 0V is applied to the control gate, a voltage of 9V is applied to the select gate and the source and drain are floating, as can be seen from a second transistor in FIG. 3.

In case of the first transistor, the erase condition does not exist since the source voltage is not transmitted via the select gate because the voltage of the select gate is 0V. In case of the second transistor, the erase operation does not exist though the source voltage can be transmitted via the select gate but no supply of the power is provided to the source since it becomes floating.

As mentioned above, the present invention has an outstanding effect that it can reduce the erase time by erasing the flash memory device on a byte or word basis.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of erasing a first cell in a flash memory device, the first cell of the flash memory device having associated therewith a source, a drain, a floating gate, a control gate and a select gate, the method comprising the steps of:

applying a high negative voltage to the control gate;
    applying a high positive voltage to the select gate;
    applying a power supply voltage to the source; and
    floating the drain,
    all substantially simultaneously,
    wherein the flash memory device comprises a second cell having associated therewith a second control gate, a second select gate, a second source and a second drain, the second cell being adjacent to said first cell, and the method further comprises the steps of:
    applying a high negative voltage to the second control gate;
    applying a voltage of 0 V to the second select gate;
    applying a power supply voltage to the second source; and
    floating the second drain,
    all substantially simultaneously.

2. The method of erasing according to claim 1, wherein the flash memory device further comprises a third cell having associated therewith a third control gate, a third select gate, a third source and a third drain, the third cell also being adjacent to said first cell, and the method further comprises the steps of:

applying a voltage of 0 V to the third control gate;
    applying a high positive voltage to the third select gate; and
    floating the third source and the third drain,
    all substantially simultaneously.

3. A method of erasing a first cell in a flash memory device, the first cell of the flash memory device having associated therewith a source, a drain, a floating gate, a control gate and a select gate, the method comprising the steps of:

applying a high negative voltage to the control gate;
    applying a high positive voltage to the select gate;
    applying a power supply voltage to the source; and
    floating the drain,
    all substantially simultaneously,
    wherein the flash memory device comprises a second cell having associated therewith a second control gate, a second select gate, a second source and a second drain, the second cell being adjacent to said first cell, and the method further comprises the steps of:
    applying a voltage of 0 V to the second control gate;
    applying a high positive voltage to the second select gate; and
    floating the second source and the second drain,
    all substantially simultaneously.

4. In a flash memory device having a first cell, a second cell adjacent to the first cell, and a third cell also adjacent to the first cell, the first cell having associated therewith a first control gate, a first select gate, a first source and a first drain, the second cell having associated therewith a second control gate, a second select gate, a second source and a second drain, and the third cell having associated therewith a third control gate, a third select gate, a third source and a third drain, a method for erasing the first cell without erasing either the second or third cells comprising the steps of:

applying a high negative voltage to the first control gate, a high positive voltage to the first select gate, a power supply voltage to the first source, and floating the first drain;
    applying a high negative voltage to the second control gate, a voltage of 0 V to the second select gate, a power supply voltage to the second source, and floating the second drain; and
    applying a voltage of 0 V to the third control gate, a high positive voltage to the third select gate, and floating the third source and the third drain.

5. A method of erasing a flash memory device having a plurality of split-gate type flash memory cells, each of which comprises a source, a drain, a floating gate, a control gate and a select gate, the method comprising the steps of:

applying a high negative voltage to the control gate of each memory cell to be erased;
    applying a high positive voltage to the select gate of each memory cell to be erased;
    applying a power supply voltage to the source of each memory cell to be erased;
    floating the drain of each memory cell to be erased;
    applying a high negative voltage to the control gate of each memory cell not to be erased;
    applying a voltage of 0 volts to the select gate of each memory cell not to be erased;
    applying a power supply voltage to the source of each memory cell not to be erased;
    floating the drain of each memory cell not to be erased,
    all substantially simultaneously.

6. A method of erasing a first split-gate type cell in a flash memory device, the first split-gate type cell of the flash memory device having associated therewith a source, a drain, a floating gate, a control gate and a select gate, the method comprising the steps of:

applying a high negative voltage to the control gate;
    applying a high positive voltage to the select gate;
    applying a power supply voltage to the source; and
    floating the drain,
    all substantially simultaneously.

7. The method of erasing according to claim 1, wherein the flash memory device comprises a second split-gate type cell having associated therewith a second control gate, a second select gate, a second source and a second drain, the second split-gate type cell being adjacent to said first split-gate type cell, and the method further comprises the steps of:

applying a high negative voltage to the second control gate;
    applying a voltage of 0 V to the second select gate;

applying a power supply voltage to the second source; and floating the second drain, all substantially simultaneously.

8. The method of erasing according to claim 1, wherein the flash memory device comprises a second split-gate type cell having associated therewith a second control gate, a second select gate, a second source and a second drain, the second split-gate type cell being adjacent to said first split-gate type cell, and the method further comprises the steps of:

applying a voltage of 0 V to the second control gate;

applying a high positive voltage to the second select gate; and floating the second source and the second drain, all substantially simultaneously.

9. The method of erasing according to claim 7, wherein the flash memory device further comprises a third split-gate type cell having associated therewith a third control gate, a third select gate, a third source and a third drain, the third split-gate type cell also being adjacent to said first split-gate type cell, and the method further comprises the steps of:

applying a voltage of 0 V to the third control gate;

applying a high positive voltage to the third select gate; and floating the third source and the third drain, all substantially simultaneously.

10. In a flash memory device having a first split-gate type cell, a second split-gate type cell adjacent to the first split-gate type cell, and a third split-gate type cell also adjacent to the first split-gate type cell, the first split-gate type cell having associated therewith a first control gate, a first select gate, a first source and a first drain, the second split-gate type cell having associated therewith a second control gate, a second select gate, a second source and a second drain, and the third split-gate type cell having associated therewith a third control gate, a third select gate, a third source and a third drain, a method for erasing the first split-gate type cell without erasing either the second or third split-gate type cells comprising the steps of:

applying a high negative voltage to the first control gate, a high positive voltage to the first select gate, a power supply voltage to the first source, and floating the first drain;

applying a high negative voltage to the second control gate, a voltage of 0 V to the second select gate, a power supply voltage to the second source, and floating the second drain; and applying a voltage of 0 V to the third control gate, a high positive voltage to the third select gate, and floating the third source and the third drain.

* * * * *